US009472422B2

(12) United States Patent
Hong

(10) Patent No.: US 9,472,422 B2
(45) Date of Patent: Oct. 18, 2016

(54) SEMICONDUCTOR DEVICE STRUCTURE AND MANUFACTURING METHODS

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Zhongshan Hong, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/856,545

(22) Filed: Sep. 16, 2015

(65) Prior Publication Data

US 2016/0093513 A1    Mar. 31, 2016

(30) Foreign Application Priority Data

Sep. 26, 2014    (CN) .......................... 2014 1 0500255

(51) Int. Cl.
| | |
|---|---|
| *H01L 21/3213* | (2006.01) |
| *H01L 21/768* | (2006.01) |
| *H01L 27/115* | (2006.01) |
| *H01L 23/522* | (2006.01) |
| *H01L 23/528* | (2006.01) |

(52) U.S. Cl.
CPC ... *H01L 21/32139* (2013.01); *H01L 21/76802* (2013.01); *H01L 21/76877* (2013.01); *H01L 23/528* (2013.01); *H01L 23/5226* (2013.01); *H01L 27/11556* (2013.01); *H01L 27/11575* (2013.01); *H01L 27/11582* (2013.01)

(58) Field of Classification Search
CPC ................... H01L 27/11556; H01L 27/11582; H01L 27/11575; H01L 23/528; H01L 23/5226
See application file for complete search history.

(56) References Cited

U.S. PATENT DOCUMENTS

| | | | | |
|---|---|---|---|---|
| 8,809,938 B2 * | 8/2014 | Hwang | ............ | H01L 27/11565 257/324 |
| 9,230,904 B2 * | 1/2016 | Eun | ...................... | H01L 27/2481 |
| 2010/0213526 A1 * | 8/2010 | Wada | ................ | H01L 21/76808 257/314 |

* cited by examiner

*Primary Examiner* — Karen Kusumakar
(74) *Attorney, Agent, or Firm* — Kilpatrick Townsend & Stockton LLP

(57) ABSTRACT

A method for forming a semiconductor device includes providing a semiconductor structure which has a substrate and N sub-stack structures numbered from 1 to N, where N is an integer. Each sub-stack structure includes two sub-stacks, and a mask layer overlying the N sub-stack structures. The method also includes repeatedly removing a portion of the mask layer and removing exposed portions of the sub-stack structures to form a first stepped structure, and forming first spacers on sidewalls of the mask layer and the sub-stack structures in the stepped structure, each spacer covering a portion of the exposure portions of the sub-stack structures. The method further includes using the mask layer and the first spacers as masks to remove exposed portions of an upper sub-stack in the first stepped structure, and removing the mask layer and the spacers to form a second stepped structure.

20 Claims, 16 Drawing Sheets

SEMICONDUCTOR DEVICE STRUCTURE AND MANUFACTURING METHODS

CROSS-REFERENCES TO RELATED APPLICATIONS

This application claims priority to Chinese patent application No. 201410500255.4, filed on Sep. 26, 2014, the content of which is incorporated herein by reference in its entirety.

BACKGROUND OF THE INVENTION

The present invention relates to the field of semiconductor technology. Specifically, embodiments of the invention are directed to three-dimensional (3D) contact structures in a semiconductor device.

In conventional fabrication methods, to form a contact to each word line in a three-dimensional (3D) memory requires repeated operations of patterning a mask layer, etching an insulating layer, and etching a conductive layer. In order to increase storage capacity, the number of layers keeps increasing in 3D memories. Therefore, the number of repeated operations is also increasing.

The inventors have observed that, with the increase in the number of layers, the process margin becomes smaller for conventional methods and process steps. In addition, since the mask layer is repeatedly patterned, the conventional method requires a thicker starting mask layer, which makes it difficult to achieve precise dimensional control, and it can be susceptible to accumulated errors. As a result, the error margin is reduced, and process time and cost is increased.

BRIEF SUMMARY OF THE INVENTION

Embodiments of the present invention provide methods for forming 3-D contact structures in a semiconductor device, for example, a semiconductor memory. A pattern and etch process is often performed in order to expose each conductive layer for making a contact structure. In some embodiments of the invention, two layers are exposed in one pattern and etch in process. In some embodiments, four or more layers are exposed in one pattern and etch in process. The layers are further separated using one or more spacer processes. As a result, the numbers of masks, patterning steps, and etch steps can all be reduced. Therefore, accumulation of any error in each resist patterning process is much reduced. Further, the cost of the mask reticle making, resist patterning process, and etch process can all be reduced, and production efficiency can be improved.

According to some embodiments of the present invention, a method for forming a semiconductor device includes providing a semiconductor structure which has a substrate, N sub-stack structures numbered from 1 to N, where N is an integer. Each sub-stack structure includes two sub-stacks, and a mask layer overlying the N sub-stack structures. The method also includes repeatedly removing a portion of the mask layer and removing exposed portions of the sub-stack structures to form a first stepped structure, and forming first spacers on sidewalls of the mask layer and the sub-stack structures in the stepped structure, each spacer covering a portion of the exposure portions of the sub-stack structures. The method further includes using the mask layer and the first spacers as masks to remove exposed portions of an upper sub-stack in the stepped structure, and removing the mask layer and the spacers to form a second stepped structure.

In some embodiments, each sub-stack includes an insulator material layer and a conductive material layer. In an embodiment, the insulator material can include an oxide material. In an embodiment, the conductive material comprises one or more of polysilicon and metal. In some embodiments, removing an exposed portion of a sub-stack structure includes anisotropically etching the insulator material layer, and anisotropically etching the conductive material layer.

In some embodiments, the method also includes the following steps for forming the first stepped structure:
  for an integer i=1 to N, removing the ith portion of the mask layer to expose the ith portion of the Nth sub-stack structure, wherein the ith portion is adjacent to the (i+1)th portion;
  for each i, removing an exposed portion of the (N−j+1)th sub-stack structure to expose the (i−j+1)th portion of the (N−j)th sub-stack structure, where j is an integer, and j=1 to i; and
  removing the Nth portion of the mask layer to expose the Nth portion of the Nth sub-stack structure, wherein the Nth portion is adjacent to an (N−1)th portion.

In some embodiments, the method also includes the following steps for forming the first spacers:
  forming a first spacer material on the first stepped structure; and
  etching the first spacer material to form the first spacers.

In some embodiments, the first spacer material includes one or more of polysilicon, amorphous silicon, and amorphous carbon. In some embodiments, the width of a first sidewall spacer is about half of the exposed portion of the sub-stack structure under the first sidewall. In some embodiments, the method also includes forming an interlayer dielectric layer overlying the second stepped structure, forming a contact on each of the exposed portions of the sub-stack structures, and forming a word line plug through the interlayer dielectric layer for coupling a word line to the contact. In some embodiments, each sub-stack includes a first material layer and a second material layer.

In some embodiments of the above method, each sub-stack includes a first stack and a second stack, each of the first stack and the second stack including an insulator material layer and a conductive material layer. In some embodiments, the conductive material comprises one or more of polysilicon and metal.

In some embodiments, the method also includes removing the first spacers to form a third stepped structure, forming second spacers on side walls of the mask layer and the sub-stacks, removing upper stacks in the exposed portions of the sub-stacks, and removing the mask layer, the second spacers to form the fourth stepped structure. In some embodiments, forming the second spacers further includes forming a second spacer material on the third stepped structure, and etching the second spacer material to form the second spacers.

In some embodiments, the width of a second sidewall spacer is about half of the exposed portion of the sub-stack structure under the second sidewall. In some embodiments, the first spacer material can include one or more of polysilicon, amorphous silicon, and amorphous carbon. In some embodiments, the step of removing upper stacks in the exposed portions of the sub-stacks includes anisotropically etching the insulator material layer, and anisotropically etching the conductive material layer. In some embodiments, the number of the first spacers is N, and the number of the second spacers is 2N. In some embodiments, the method also includes forming an interlayer dielectric layer overlying the second stepped structure, forming a contact on each of the exposed portions of the stack, and forming a word line plug through the interlayer dielectric layer for coupling a word line to the contact.

The following description, together with the accompanying drawings, will provide further understanding of the nature and advantages of the claimed invention.

DETAILED DESCRIPTION OF THE INVENTION

Figure 1:
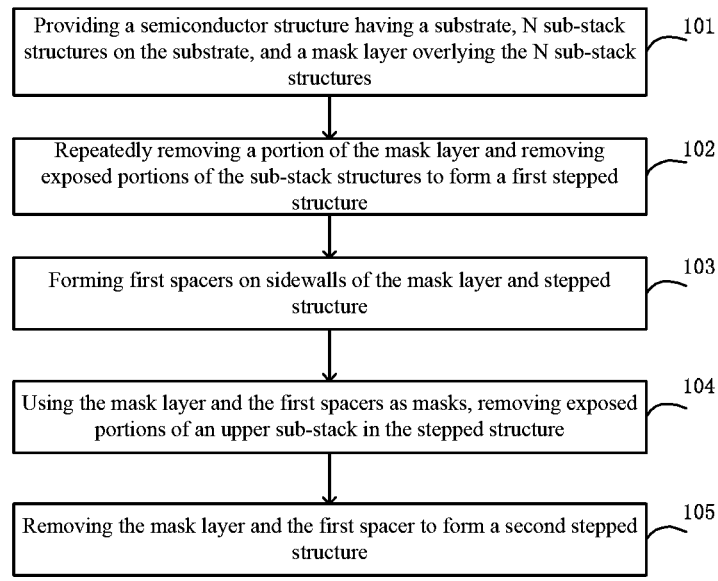
FIG. 1 is a simplified flow chart of a method for manufacturing a semiconductor device structure according to an embodiment of the present invention.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the sizes of the various components shown in the drawings are not necessarily drawn to actual proportional relationships. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

FIG. 1 is a simplified flow chart of a method for manufacturing a semiconductor device structure according to an embodiment of the present invention. The method illustrated in FIG. 1 includes steps 101-105, which are summarized below.

Step 101: Providing a semiconductor structure having a substrate, N sub-stack structures on the substrate, and a mask layer overlying the N sub-stack structures;

Step 102: Repeatedly removing a portion of the mask layer and removing exposed portions of the sub-stack structures to form a first stepped structure;

Step 103: Forming first spacers on sidewalls of the mask layer and stepped structure;

Step 104: Using the mask layer and the first spacers as masks, removing exposed portions of an upper sub-stack in the stepped structure; and Step 105: Removing the mask layer and the first spacer to form a second stepped structure.

These steps are now explained below with reference to cross-sectional view diagrams in FIGS. 4-16.

Figure 4:
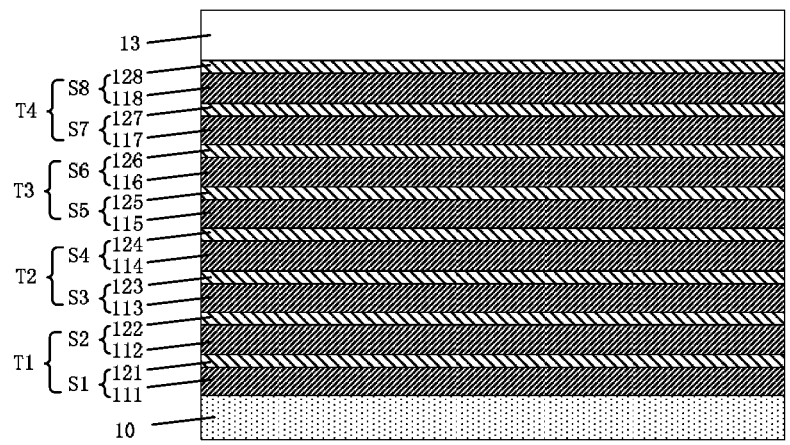
FIGS. 4-16 are cross-sectional view diagrams illustrating the method of FIG. 1.

At step 101, as shown in FIG. 4, there is provided a semiconductor structure, which includes a stack structure (T1-T4) on a substrate 10. In this example, N=4. A mask layer 13 is disposed on the stack structure. The stack structure includes N sub-stack structures numbered 1-N, where N is an integer greater than 1. Merely as an example, stack structure (T1-T4) includes four sub-stack structures, T1, T2, T3, and T4, as shown in FIG. 4. In the example of FIG. 4, each sub-stack structure includes two sub-stacks. For example, first sub-stack structure T1 includes two sub-stacks S1 and S2. In this embodiment, each sub-stack includes a layer of conductive material and the insulating material layer. For example, each of sub-stacks S1-S4 includes a conductive material layer (111, 112, 113, and 114, respectively) and an insulating material layer (121, 122, 123, and 124, respectively).

In some alternative embodiments, each of the sub-stack structures includes four sub-stacks. In some other embodiments, each of the sub-stack structures can include eight sub-stacks, or 16 sub-stacks, etc. Further, depending on the embodiment, each sub-stack can include two, four, eight, etc., layers of alternate conductive material layers and insulating material layers.

The alternately laminated layers of conductive material and insulating material layer may form a vertical memory device array region and a stepped region, as will be shown below. The layer of conductive material may include any suitable conductive material. By way of example, and not meant to be limiting, the electrically conductive material layer may include one or more of polysilicon and metal (e.g., tungsten, nickel, titanium, platinum, aluminum, gold, tungsten nitride, tantalum nitride, titanium nitride, etc.). Similarly, the insulating layer may be formed of any suitable insulating material. By way of example, and not being limiting, the insulating material layer may include silicon oxide (e.g., $SiO_2$). Each group of layers of conductive material and an insulating material layer (i.e., each sub-stack) may have a thickness between 0.1-0.6 μm.

Figure 2:
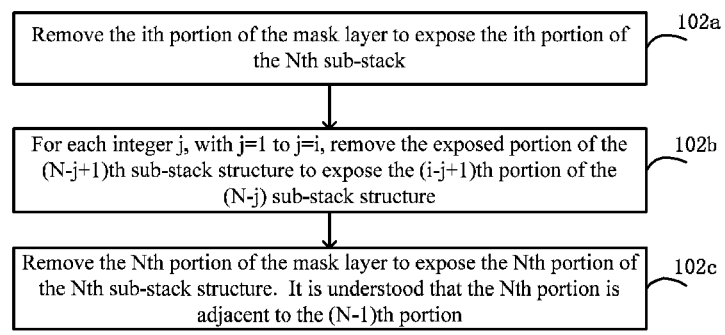
FIG. 2 is a simplified flow chart illustrating a detailed process of part of the method of FIG. 1 according to an embodiment of the present invention.

At step 102, the method includes removing a portion of the mask layer and performing an etch step to remove exposed portions of sub-stack structures. Further, this operation is repeated to form a staircase structure. FIG. 2 is a simplified flow chart illustrating a detailed process of step 102, in which steps 102a-102c are repeated for each integer i from i=1 to i=N−1, where N is the number of sub-stacks in the sub-stack structure. Steps 102a-102c are listed below, which will be explained with reference to FIGS. 5-11.

Step 102a: Remove the ith portion of the mask layer to expose the ith portion of the Nth sub-stack. It is understood that the ith portion is adjacent to the (i+1)th portion. In an embodiment, this process includes using an anisotropic etch to remove the dielectric material layer and using an anisotropic etch to remove the conductive material layer;

Step 102b: For each integer j, with j=1 to j=i, remove the exposed portion of the (N−j+1)th sub-stack structure to expose the (i−j+1)th portion of the (N−j) sub-stack structure;

Step 102c: Remove the Nth portion of the mask layer to expose the Nth portion of the Nth sub-stack structure. It is understood that the Nth portion is adjacent to the (N−1)th portion.

Step 102 in FIG. 1 and steps 102a-102c in FIG. 2 are now explained with reference to FIGS. 5-11.

Figure 5:
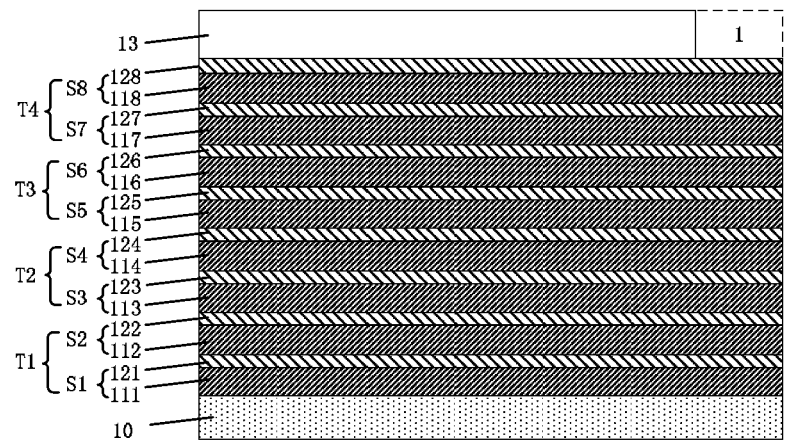

At step 102a, as shown in FIG. 5, a first portion of mask layer 13 is removed to expose a first portion of sub-stack structure T4. In an embodiment, the mask layer can be a photoresist layer and it can be patterned using conventional photoresist patterning processes.

Figure 6:
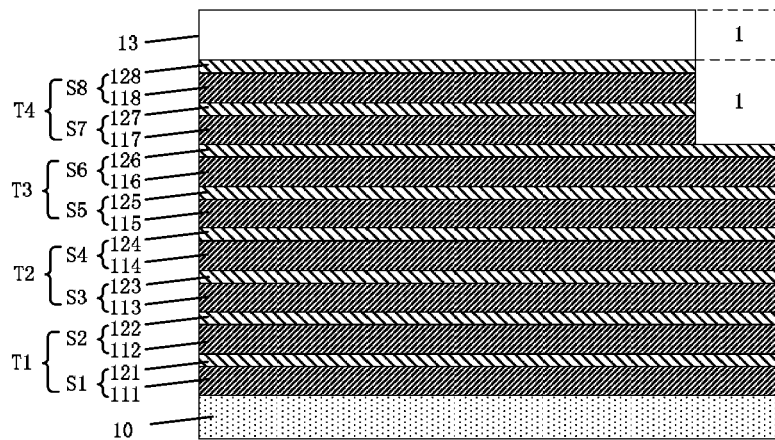

Next, as shown in FIG. 6, the exposed portion of the sub-stack structure of T4 is removed to expose a first portion of sub-stack structure of T3. In this embodiment, a portion of a depth of the sub-stack structure is removed, i.e. the thickness of two sub-stacks is removed, each sub-stack having an insulating material and a conductive material layer. In an embodiment, the removal process can include anisotropically etching the insulating material layer 128, the conductive material layer 118, dielectric material layer 127, and the conductive material layer 117. Different etch chemistries can be used to etch the insulating material and the conductive material layers.

Figure 7:
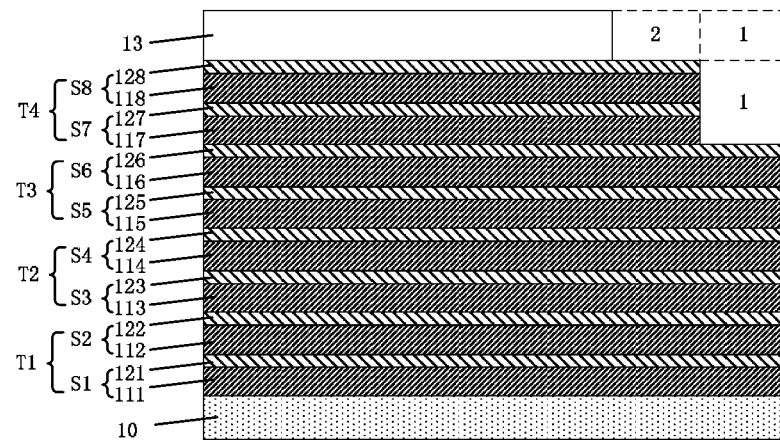

At step 102b, as shown in FIG. 7, a second portion of mask layer 13, which is adjacent to the first portion, is removed to expose a second portion of sub-stack structure T4. In an embodiment, the mask layer can be a photoresist layer and it can be patterned using conventional photoresist patterning processes.

Figure 8:
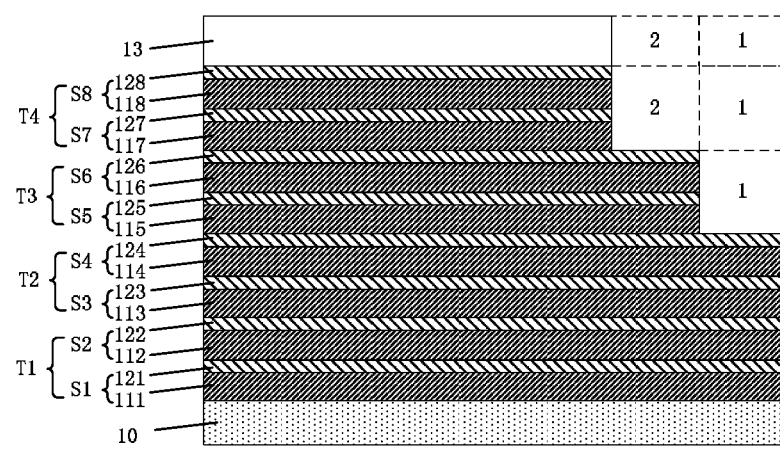

Next, as shown in FIG. 8, the exposed portions of sub-stacks T4 and T3 are removed. In this process, a first portion of sub-stack T3 is removed to expose a first portion of sub-stack T2, and a second portion of sub-stack T4 is removed to expose a second portion of sub-stack T3.

Figure 9:
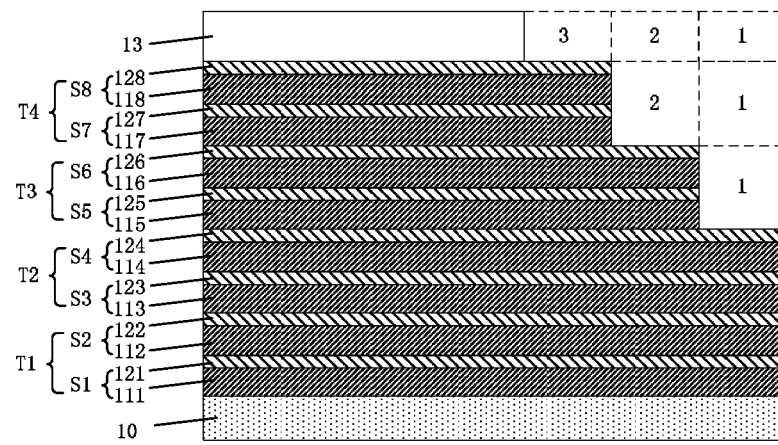
Figure 10:
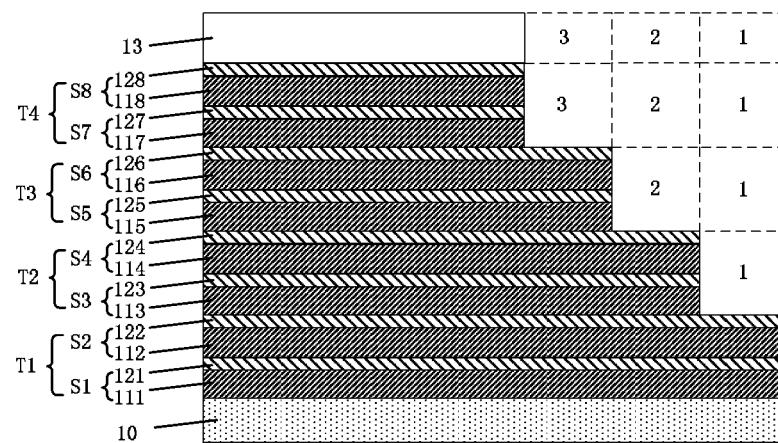

In FIG. 9, a third portion of mask layer 13 is removed to expose a third portion of sub-stack T4. Then, as shown in FIG. 10, the exposed portions of sub-stacks T4, T3, and T2 are removed, causing a first portion of T1, a second portion of T2, and a third portion of T3 to be exposed.

Figure 11:
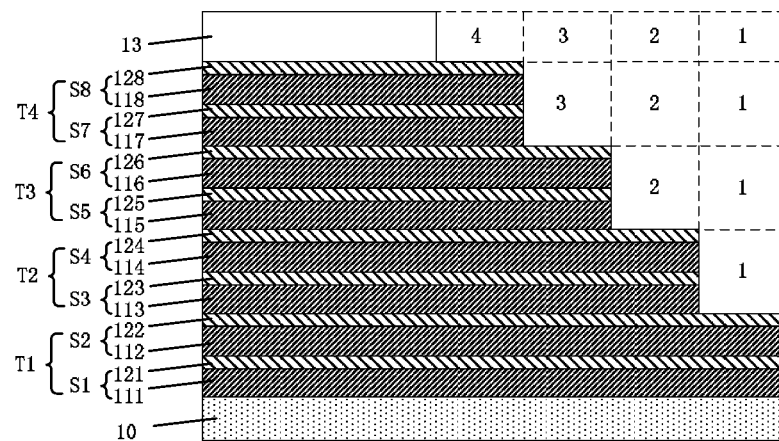

At step 102c, as shown in FIG. 11, a fourth portion of mask layer 13 is removed to expose a fourth portion of sub-stack structure T4. In this embodiment, the fourth portion is the last portion to be process, i.e., N=4.

In the embodiment described in FIGS. 5 through 11, a repeated process is carried out to remove a portion of the mask layer and remove the exposed portions of the sub-stack structures to form a stepped structure, in which a portion of each sub-stack of structures T1-T4 is exposed. The height of each step in the stepped structure is determined by the height of the sub-stack structure, e.g., 0.2-1.2 μm. The width of each step is determined by the length of each portion of the mask layer removed, which may be between 0.4-2 μm.

Figure 3:
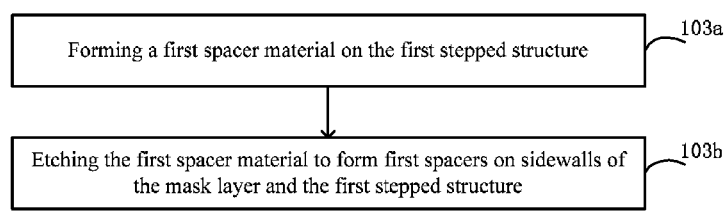
FIG. 3 is a simplified flow chart illustrating a detailed process of another part of the method of FIG. 1 according to an embodiment of the present invention.

At step 103 in FIG. 1, the method includes forming first spacers at the sidewall of the mask layer and the sidewalls of the sub-stack structures. Each spacer covers a portion of the exposed portion of the sub-stack structure disposed under the spacer. FIG. 3 is a simplified flow chart illustrating a detailed process of step 103. FIG. 3 includes steps 103a and 103b, which are listed below, and will be explained with reference to FIGS. 12 and 13.

Step 103a: Forming a first spacer material on the first stepped structure; and

Step 103b: Etching the first spacer material to form first spacers on sidewalls of the mask layer and the first stepped structure.

Figure 12:
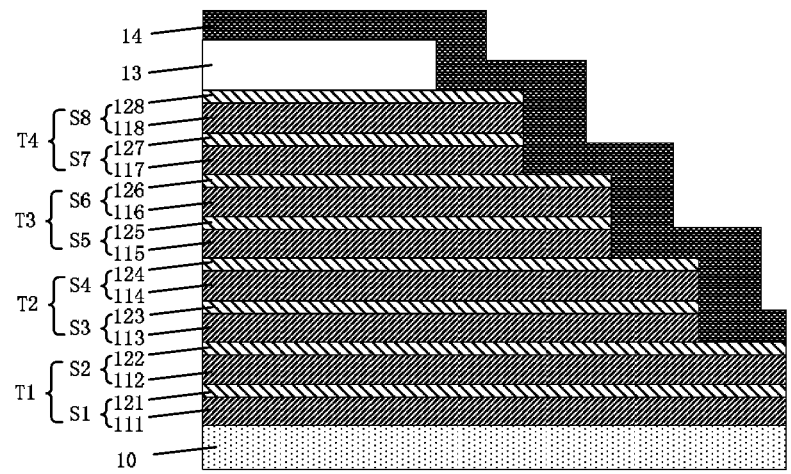
Figure 13:
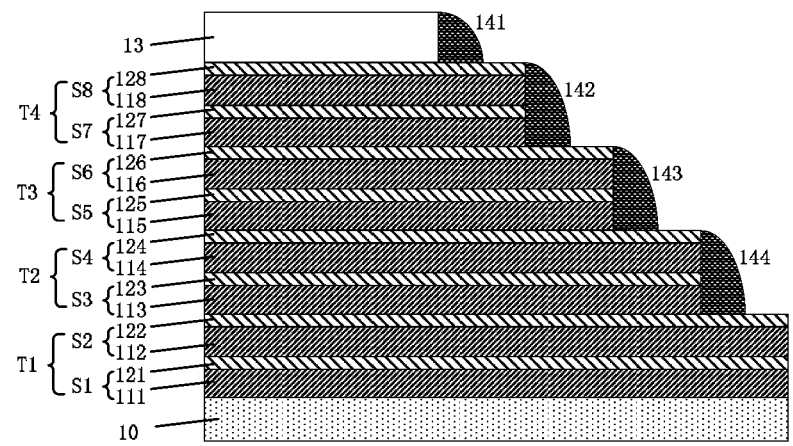

At step 103a, as shown in FIG. 12, a spacer material 13 is formed on exposed portions of the stepped structure. The first sidewall spacer material may be polycrystalline silicon, amorphous silicon or amorphous carbon. In some embodiments, the spacer material is chosen to have favorable etch selectivity with respect to the insulating material and the conductive material.

At step 103b, spacer material 13 is etched to form sidewalls 141-144 on the sidewalls of mask layer 13 and sub-stack structures T1-T4. Each of the sidewalls is configured to cover a portion of the exposed portion of the sub-stack structure which is adjacent to and underneath the space. In the specific embodiment of FIG. 13, there are four sidewall spacers, and the width of each sidewall is about half that of the exposed portion of the sub-stack structure on which the spacer is disposed.

Figure 14:
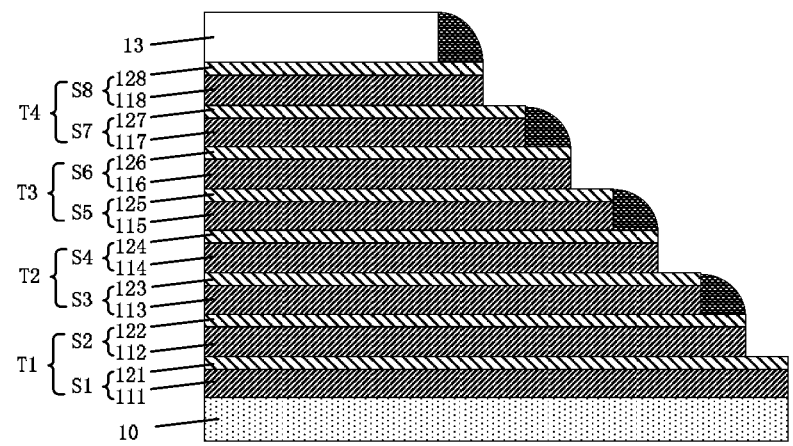

At step 104 in FIG. 1, as shown in FIG. 14, exposed portions of sub-stacks are removed. In other words, the portions of the sub-stacks uncovered by the spacers are removed using mask layer 13 and spacers 141-144 as a mask. This removal process can be carried out by anisotropically etching the first layer of a sub-stack and then the second layer. In FIG. 14, the insulating material is etched first, followed by the conductive material. The etch process can be repeated to remove the second sub-stack in each sub-stack structure.

Figure 15:
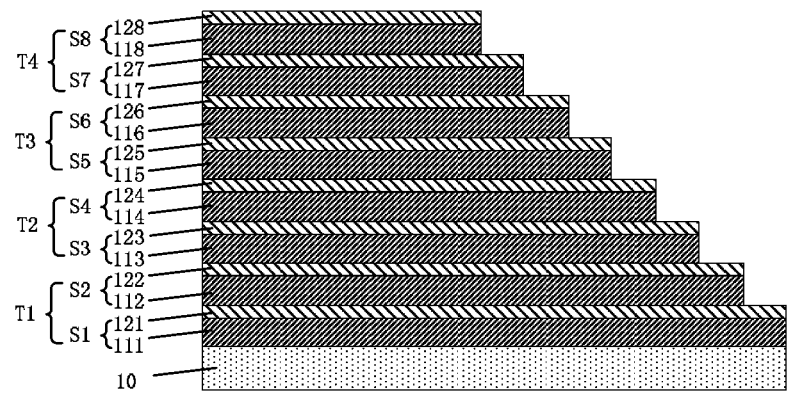

At step 105 in FIG. 1, as shown in FIG. 15, the mask layer and the sidewall spacers are removed to form a second stepped structure. In this embodiment, the second stepped structure has eight steps, one for each sub-stack S1-S8. The height of each step is determined by the height of each sub-stack, e.g., between 0.1-0.6 μm, and the width of each step can be, e.g., 0.2-1.0 μm. It can be seen that each of sub-stacks S1-S8 has an exposed portion.

Figure 16:
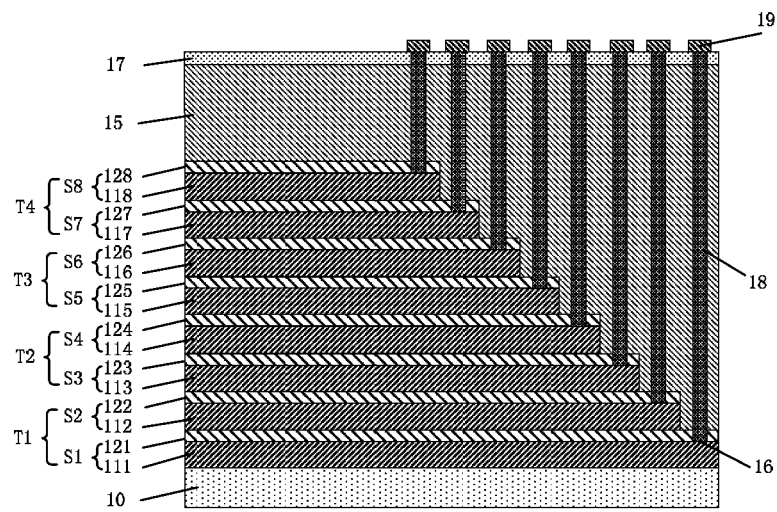

Next, in FIG. 16, a contact 16 is made to the exposed portion of each sub-stack of the second stepped structure in FIG. 15. First, an interlayer dielectric layer 15 is formed on the second stepped structure. A second insulating layer 17 is formed on interlayer dielectric layer 15. The dielectric layers are etched to form contact openings 18 through second insulating layer 17, interlayer dielectric layer 15, and insulating layers 121-128 in each sub-stack to reach conductive material layers 111-118. The contact openings are filled with a conductive material to form word line vias 18 to connect word lines 19 and contact 16. The second insulating layer can include one or more of silicon oxide, borophosphosilicate glass (BPSG), and spin-on dielectric (SOD), etc. The contact conductive material may be polysilicon, tungsten, titanium, aluminum, or another conductive material.

Compared with the conventional method, the method of the present invention as described can provide a larger margin of error to form a stepped structure. For example, compared with the conventional method, the number of resist patterning operations is reduced from seven to three to form a stepped structure having eight steps. Therefore, accumulation of any error in each resist patterning process is much reduced. Further, the number of etch processes is reduced from seven to four as compared with the conventional method. The number of mask reticles is also reduced. Therefore, the cost of the mask making, resist patterning process, and etch process can all be reduced, and production efficiency can be improved.

Figure 17:
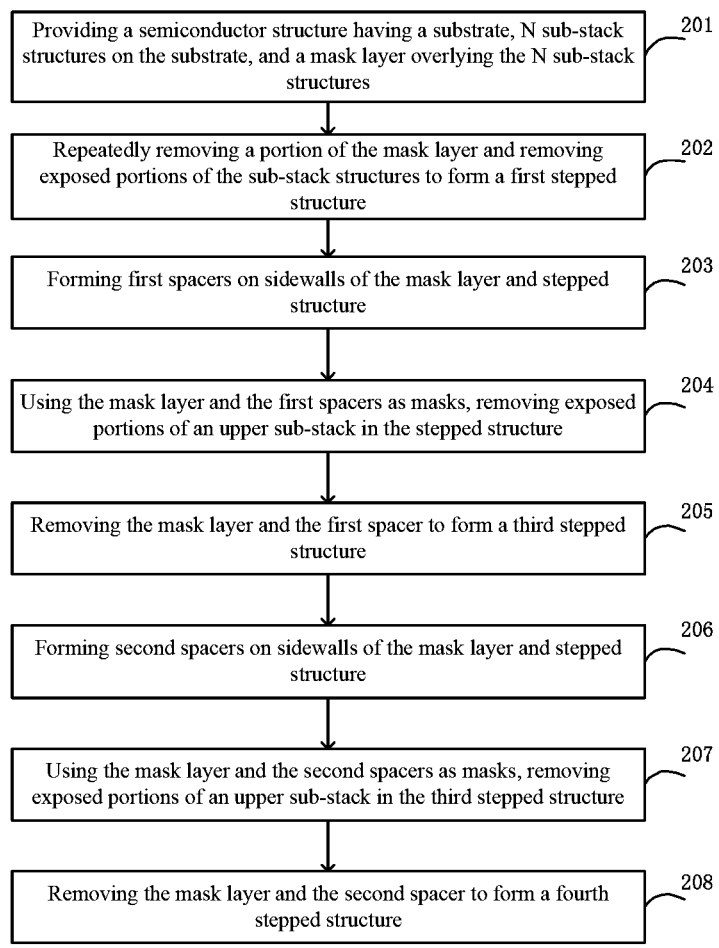
FIG. 17 is a simplified flow chart of a method for manufacturing a semiconductor device structure according to an embodiment of the present invention.

FIG. 17 is a simplified flow chart of a method for manufacturing a semiconductor device structure according to another embodiment of the present invention. This method is similar to the method described above. However, in forming the stepped structure, two sub-stack structures are etched at a time, and an additional spacer process is used to separate the two sub-stack structures. The method illustrated in FIG. 17 includes steps 201-208, which are summarized below.

Step 201: Providing a semiconductor structure having a substrate, N sub-stack structures on the substrate, and a mask layer overlying the N sub-stack structures;

Step 202: Repeatedly removing a portion of the mask layer and removing exposed portions of the sub-stack structures to form a first stepped structure;

Step 203: Forming first spacers on sidewalls of the mask layer and stepped structure;

Step 204: Using the mask layer and the first spacers as masks, removing exposed portions of an upper sub-stack in the stepped structure;

Step 205: Removing the mask layer and the first spacer to form a third stepped structure;

Step 206: Forming second spacers on sidewalls of the mask layer and stepped structure;

Step 207: Using the mask layer and the second spacers as masks, removing exposed portions of an upper sub-stack in the third stepped structure; and Step 208: Removing the mask layer and the second spacer to form a fourth stepped structure.

Figure 18:
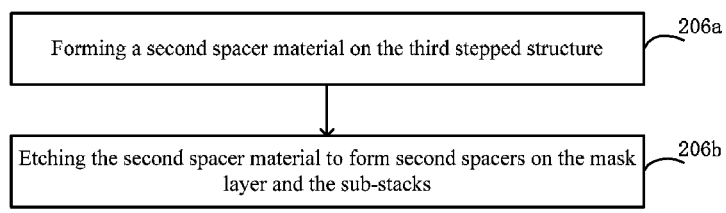
FIG. 18 is a simplified flow chart illustrating a detailed process of part of the method of FIG. 1 according to an embodiment of the present invention.

Further, step 206 is shown in detail in the following chart in FIG. 18, which includes steps 206a and 206b as summarized below.

Step: 206a: Forming a second spacer material on the third stepped structure; and Step: 206b: Etching the second spacer material to form second spacers on the mask layer and the sub-stacks.

FIGS. 19-31 are cross-sectional view diagrams illustrating the method of FIG. 17. In this method, a stepped structure is formed to expose a portion of each insulator-conductor stack similar to the method illustrated. A notable difference is that, in each masking-etching cycle, four stacks of alternating insulating material layer and conductive material layer are etched, to form a first stepped structure. The depth of materials etched in each step is four times that in the conventional process. This method is briefly described below.

Figure 19:
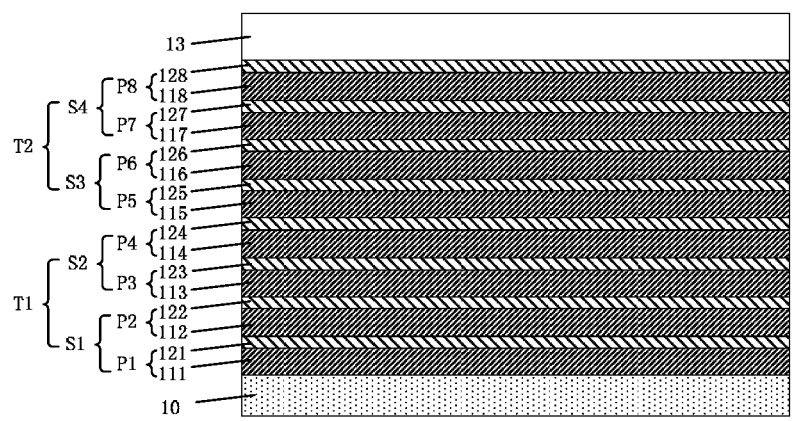
FIGS. 19-31 are cross-sectional view diagrams illustrating the method of FIG. 17.

FIG. 19 illustrates a device structure similar to that in FIG. 4 described above. However, in FIG. 19, some of the layers are relabeled for ease of description. As shown in FIG. 19, each pair or stack of insulating material layers 121-128 and conductive material layers 111-118 are labeled P1-P8, respectively. Further, each two pairs of stacks, such as P1 and P2, P3 and P4, P5 and P6, and P7 and P8 are now labeled S1-S4, respectively. S1 and S2 are labeled T1, and S3 and S4 are labeled T2.

Figure 20:
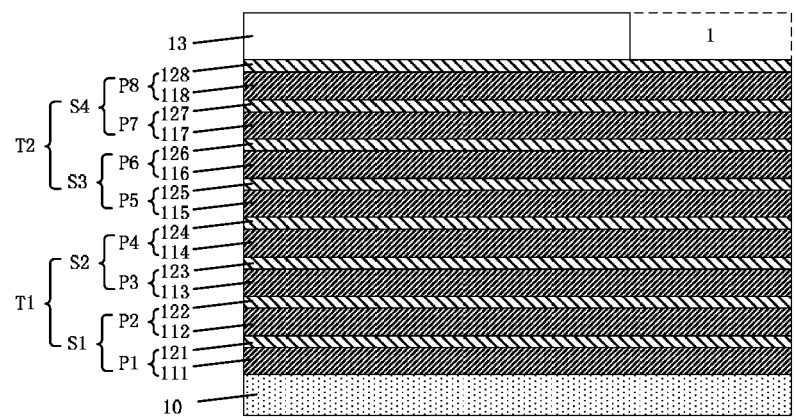
Figure 21:
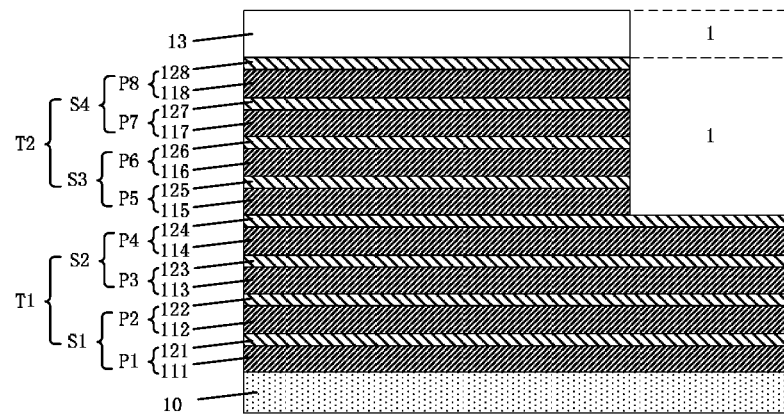
Figure 22:
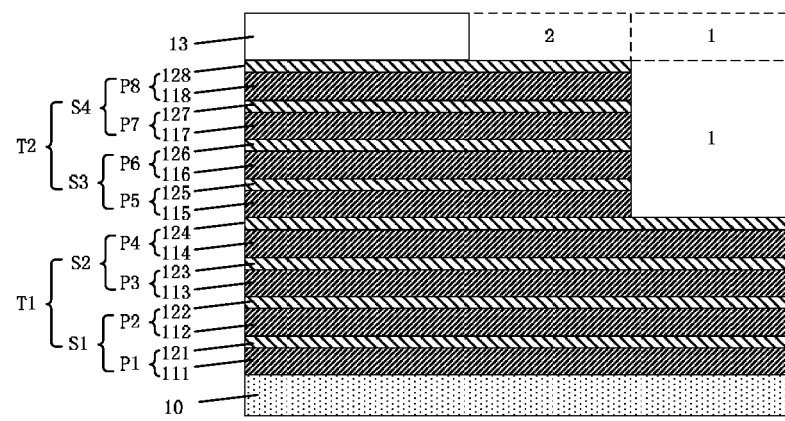
Figure 23:
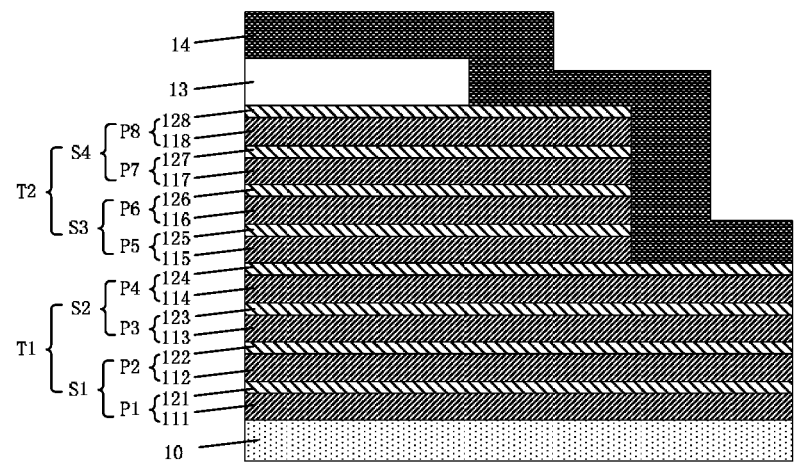
Figure 24:
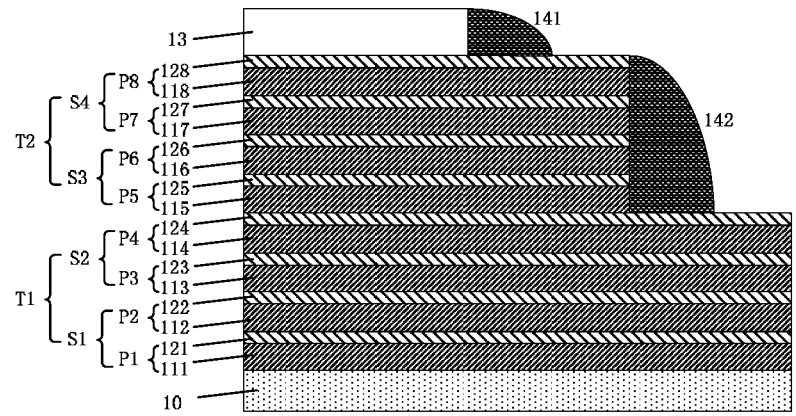
Figure 25:
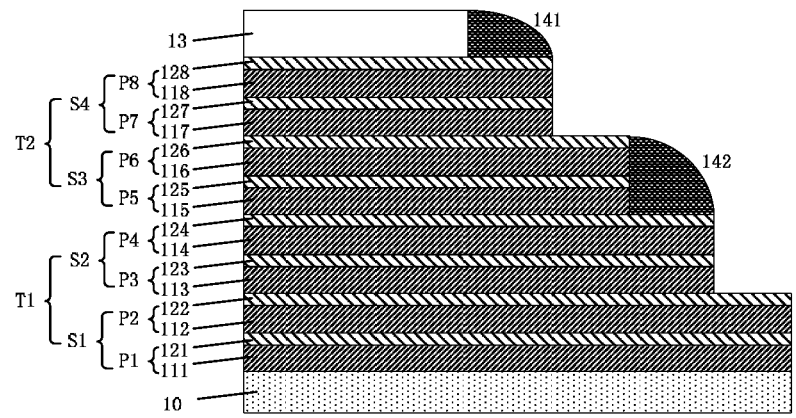
Figure 26:
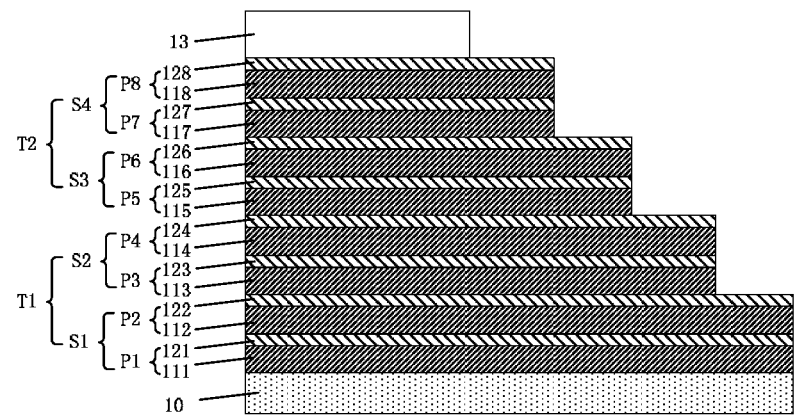
Figure 27:
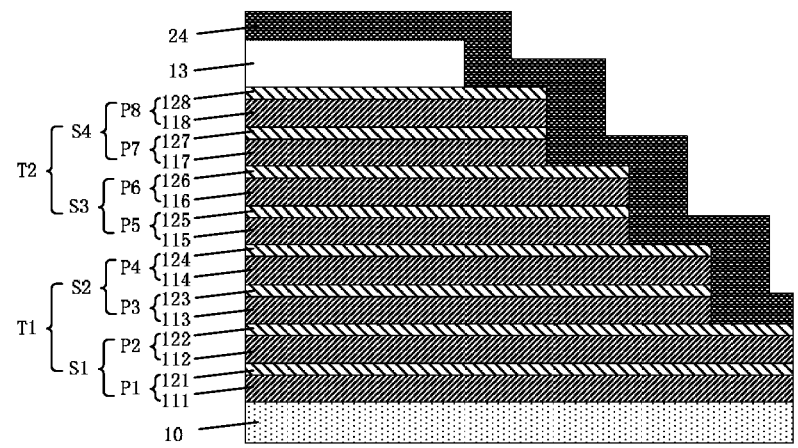

In FIGS. 20 and 21, mask layer 13 is patterned to remove a first portion, and structure T2 is etched to expose a first portion. In FIG. 22, mask layer 13 is patterned to remove a second portion to form a first stepped structure. In FIG. 23, a spacer material 14 is formed, and in FIG. 24, sidewall spacers 141 and 142 are formed. In FIG. 25, the exposed portions of P7 and P8, as well as P3 and P4, are removed. In FIG. 26, spacers 141 and 142 are removed, resulting in a third stepped structure, in which each step includes two stacks, each stack having an insulator material layer and conductive material layer, similar to the structure in FIG. 11.

Figure 28:
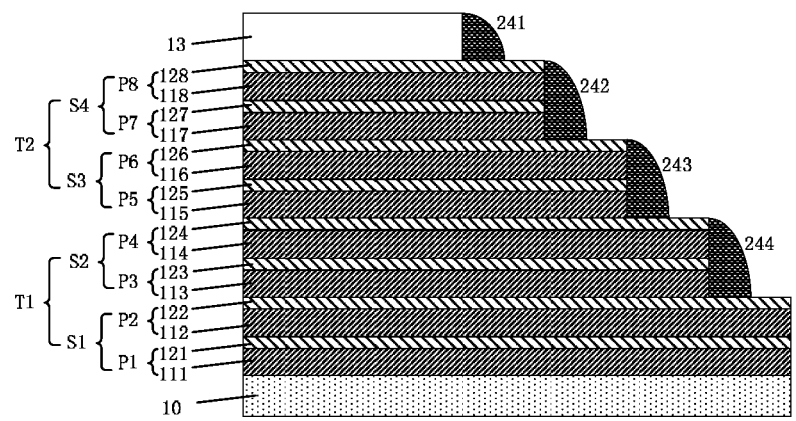
Figure 29:
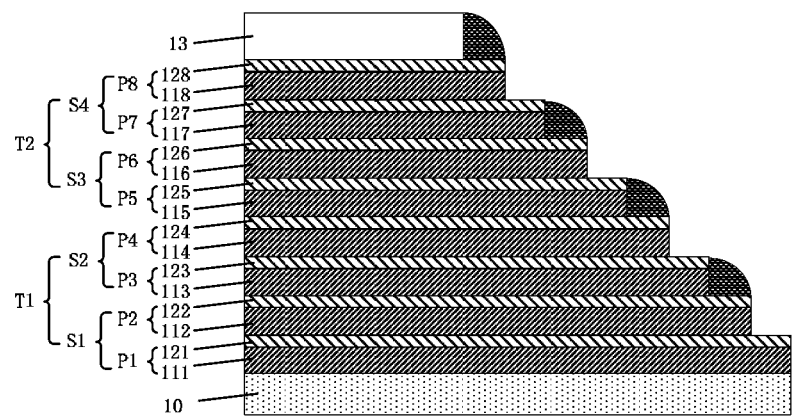
Figure 30:
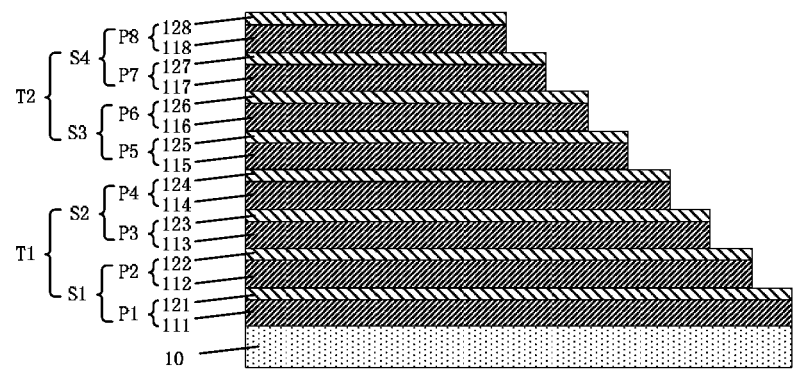
Figure 31:
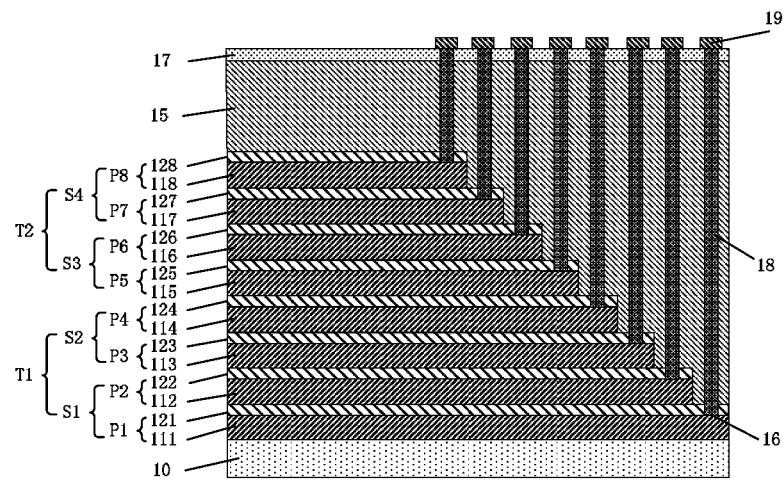

After the formation of the stepped structure in FIG. 26, the processes illustrated in FIGS. 27-31 are similar to those in FIGS. 12-16. Therefore, they are not explained in detail here. For example, in FIG. 27, a spacer material 24 is formed. In FIG. 28, spacers 241-244 are formed. In FIG. 29, exposed portions of P8, P6, P4, and P2 are etched. In FIG. 30, spacers 241-244 are removed to form a fourth stepped structure. In FIG. 31, a contact 16 is made to each conductive material layer 111-118, similar to FIG. 16.

As described above, in the above described method, in each resist patterning-etching cycle, the depth of materials etched away is four stacks or four pairs of the insulator-conductor combination, resulting in a stepped structure with each step being four steps deep. A sidewall spacer process is used to further separate the stacks to form the final stepped structure as shown in FIG. 30. Compared with the conventional method for forming a stepped structure having eight steps, the number of photoresist patterning steps is reduced from seven to two. Therefore, the accumulated error from the photo masking steps is reduced. Further, the number of masked etch processes is reduced to three. Therefore, the cost of mask reticles and process steps can be reduced, and production efficiency can be increased.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. A method for forming a semiconductor device, comprising:
   providing a semiconductor structure, having:
      a substrate,
      N sub-stack structures numbered from 1 to N overlying the substrate, where N is an integer, and each sub-stack structure includes two sub-stacks; and
      a mask layer overlying the N sub-stack structures;
   repeatedly removing a portion of the mask layer and removing exposed portions of the sub-stack structures to form a first stepped structure;
   forming first spacers on sidewalls of the mask layer and the sub-stack structures in the first stepped structure, each spacer covering a portion of the exposure portions of the sub-stack structures;
   using the mask layer and the first spacers as masks, removing exposed portions of an upper sub-stack in the stepped structure; and
   removing the mask layer and the first spacer to form a second stepped structure.

2. The method of claim 1, wherein each sub-stack comprises an insulator material layer and a conductive material layer.

3. The method of claim 2, wherein the insulator material comprises an oxide material.

4. The method of claim 2, wherein the conductive material comprises one or more of polysilicon and metal.

5. The method of claim 2, wherein removing an exposed portion of a sub-stack structure comprises:
   anisotropically etching the insulator material layer; and
   anisotropically etching the conductive material layer.

6. The device of claim 1, further comprising the following steps for forming the first stepped structure:
   for an integer i=1 to N, removing the ith portion of the mask layer to expose the ith portion of the Nth sub-stack structure, wherein the ith portion is adjacent to the (i+1)th portion;
   for each i, removing an exposed portion of the (N−j+1)th sub-stack structure to expose the (i−j+1)th portion of the (N−j)th sub-stack structure, where j is an integer, and j=1 to i; and removing the Nth portion of the mask layer to expose the Nth portion of the Nth sub-stack structure, wherein the Nth portion is adjacent to an (N−1)th portion.

7. The method of claim 1, further comprising the following steps for forming the first spacers:
  forming a first spacer material on the first stepped structure; and
  etching the first spacer material to form the first spacers.

8. The method of claim 7, wherein the first spacer material comprises one or more of polysilicon, amorphous silicon, and amorphous carbon.

9. The method of claim 1, wherein the width of a first sidewall spacer is about half of the exposed portion of the sub-stack structure under the first sidewall.

10. The method of claim 1, further comprising:
  forming an interlayer dielectric layer overlying the second stepped structure;
  forming a contact on each of the exposed portions of the sub-stack structures; and
  forming a word line plug through the interlayer dielectric layer for coupling a word line to the contact.

11. The method of claim 1, wherein each sub-stack comprises a first material layer and a second material layer.

12. The method of claim 1, wherein each sub-stack comprises a first stack and a second stack, each of the first stack and the second stack including an insulator material layer and a conductive material layer.

13. The method of claim 12, wherein the conductive material comprises one or more of polysilicon and metal.

14. The method of claim 12, further comprising:
  removing the first spacers to form a third stepped structure;
  forming second spacers on side walls of the mask layer and the sub-stacks;
  removing upper stacks in the exposed portions of the sub-stacks; and
  removing the mask layer, the second spacers to form the fourth stepped structure.

15. The method of claim 14, wherein forming the second spacers further comprises:
  forming a second spacer material on the third stepped structure; and
  etching the second spacer material to form the second spacers.

16. The method of claim 14, wherein the width of a second sidewall spacer is about half of the exposed portion of the sub-stack structure under the second sidewall.

17. The method of claim 14, wherein the first spacer material comprises one or more of polysilicon, amorphous silicon, and amorphous carbon.

18. The method of claim 14, wherein removing upper stacks in the exposed portions of the sub-stacks further comprises:
  anisotropically etching the insulator material layer; and
  anisotropically etching the conductive material layer.

19. The method of claim 14, wherein:
  the number of the first spacers is N; and
  the number of the second spacers is 2N.

20. The method of claim 14, further comprising:
  forming an interlayer dielectric layer overlying the second stepped structure;
  forming a contact on each of the exposed portions of the stack; and
  forming a word line plug through the interlayer dielectric layer for coupling a word line to the contact.

* * * * *